United States Patent [19]

Tagiri

[11] Patent Number: 5,229,719

[45] Date of Patent: Jul. 20, 1993

[54] AMPLIFIER WITH SHORT TIME LAG

[75] Inventor: Hirokazu Tagiri, Kyoto, Japan

[73] Assignee: Rohm Co., Ltd., Kyoto, Japan

[21] Appl. No.: 904,442

[22] Filed: Jun. 25, 1992

[30] Foreign Application Priority Data

Sep. 18, 1991 [JP] Japan .................................. 3-237954

[51] Int. Cl.$^5$ .............................................. H03F 1/14
[52] U.S. Cl. ........................................... 330/51; 360/67
[58] Field of Search .................. 330/51, 69, 127, 141; 358/296; 360/67, 68

[56] References Cited

U.S. PATENT DOCUMENTS

| 4,458,213 | 7/1984 | Quan | 330/296 X |
| 5,067,032 | 11/1991 | Ida | 360/68 X |

Primary Examiner—Steven Mottola
Attorney, Agent, or Firm—Thomas R. Morrison

[57] ABSTRACT

The present invention discloses an amplifier which can amplify signals based on a specific amplification factor at high speed without inhibiting electrical characteristics. A first switch 22 is connected in parallel with a third resistor 10. A second switch 24 is incorporated into an operational amplifier 6 between the inverted input and the noninverted input. A switch controlling means 26 regulates the switching of the first switch 22 and the second switch 24. When the second capacitor 14 is charged to obtain the reference voltage $V_{REF}$, the switch controlling means 26 closes the first switch 22 and the second switch 24.

6 Claims, 4 Drawing Sheets

FIG. 2 (1) (prior art)
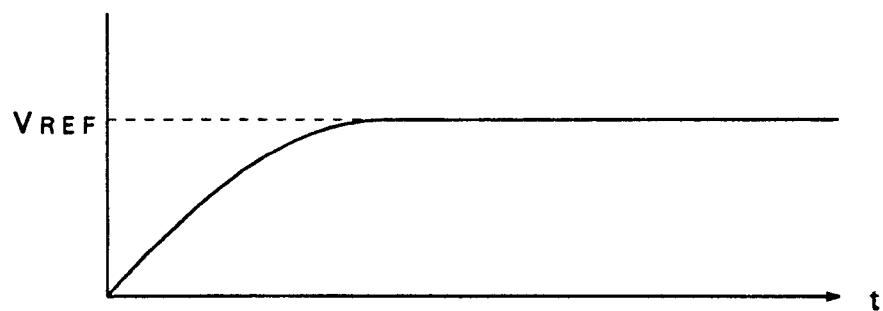
FIG. 2 (2) (prior art)
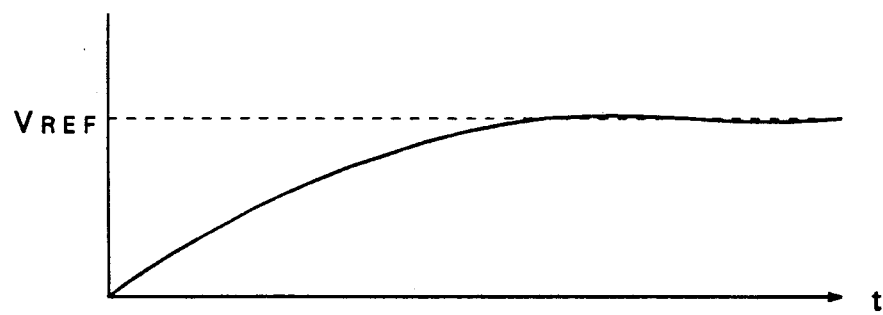
FIG. 2 (3) (prior art)
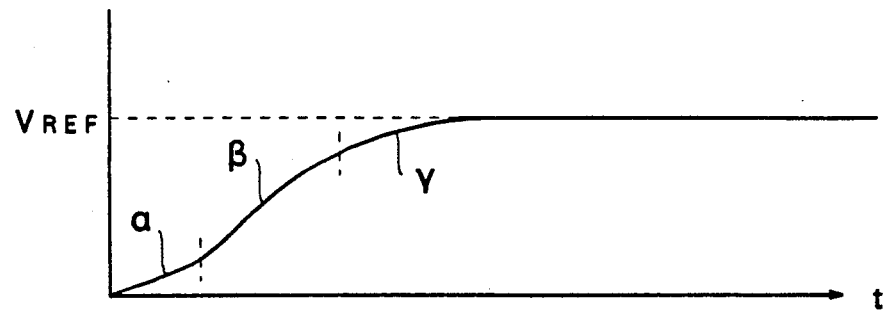

FIG. 4 (1)
FIG. 4 (2)
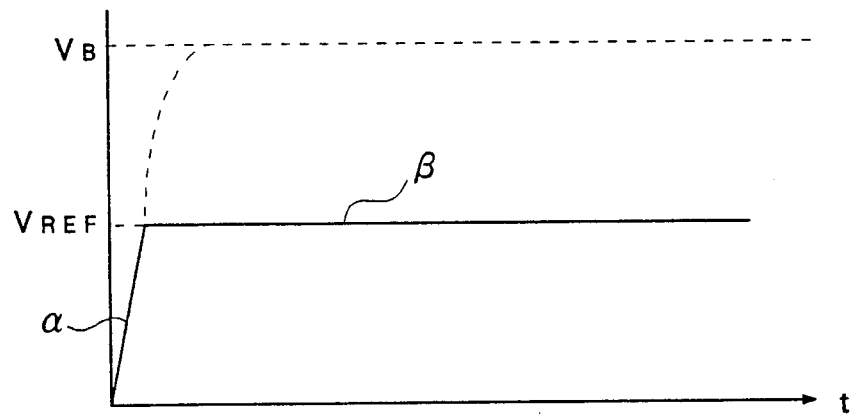
FIG. 4 (3)
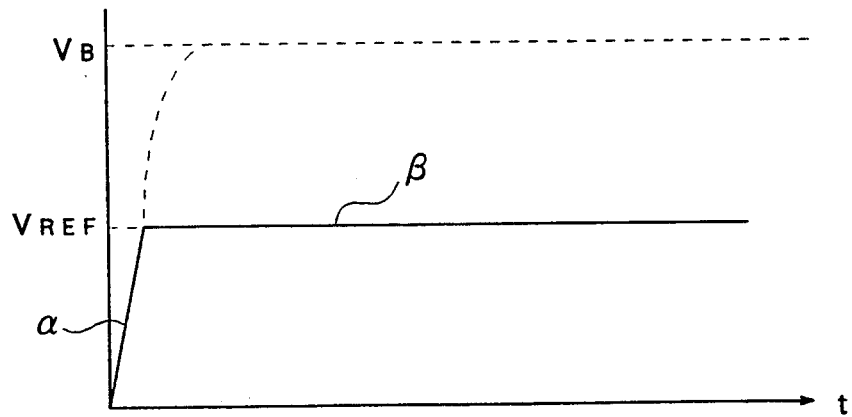

AMPLIFIER WITH SHORT TIME LAG

BACKGROUND OF THE INVENTION

The present invention relates generally to an amplifier suitable for driving the servomotor of a video tape recorder or the like and, more particularly, to an amplifier which quickly amplifies signals by a specific amplification factor based on a reference voltage.

In FIG. 1 there is shown a conventional amplifier.

A signal $e_i$ is passed to an inverted input of an operational amplifier 6 via a first capacitor 2 and a first resistor 4. An output signal from the operational amplifier 6 is fed back in to the inverted input via a second resistor 8. The resulting amplification factor A of the operational amplifier 6 is given by:

$$A = R_2/R_1$$

where $R_1$ and $R_2$ are the resistance values of the first resistor 4 and of the second resistor 8, respectively.

A supply DC voltage $V_b$, which is supplied by a power source, is divided by a voltage divider containing a third resistor 10 and a fourth resistor 12. The voltage is passed to a noninverted input of the operational amplifier 6. The divided voltage is given by:

$$\{R_4/(R_3+R_4)\} \cdot V_B$$

wherein $R_3$ and $R_4$ are the resistance values of the third resistor 10 and the fourth resistor 12, respectively. Although the divided voltage is constant under a fixed supply voltage $V_B$, the supply voltage $V_B$ may change due to noise contamination, thereby varying the divided voltage. In order to overcome this drawback, a second capacitor 14 is connected in parallel with the fourth resistor 12. Once charged, the second capacitor 14 allows a reference voltage $V_{REF}(V_{REF}=\{R_4/(R_3+R_4)\} \cdot V_B$ to remain constant, regardless of variation in the supply voltage $V_B$. In the present invention, an output e from the operational amplifier 6 is given by ($V_{REF}$+A·$e_i$), provided that the second capacitor 14 is charged to the reference voltage $V_{REF}$ and that the inverted input voltage of the operational amplifier 6 is equal to the reference voltage $V_{REF}$.

When the supply voltage $V_B$ is provided by a power source, the second capacitor 14 is charged via the third resistor 10 up to the value of reference voltage $V_{REF}$ (see FIG. 2(1)). The first capacitor 2, however, is charged by the output of the operational amplifier 6 via the second resistor 8 and the first resistor 4, at a slower rate than second capacitor 14. Thus, a considerable time lag exists between the time the inverted input voltage of the operational amplifier 6 equals reference voltage $V_{REF}$ and the second capacitor 14 fully charges (see FIG. 2(2)). In order to solve this problem, the conventional amplifier incorporates a diode 102 in the operational amplifier 6 in the forward direction between the noninverted input and the inverted input.

In an amplifier which incorporates diode 102, the first capacitor 2 is initially charged by the output of the operational amplifier 6 via the second resistor 8 and the first resistor 4 (see a in FIG. 2(3)). When the noninverted input voltage of the operational amplifier 6 exceeds the inverted input voltage by a forward voltage $V_F$ of the diode 102, the diode 102 conducts. This causes the first capacitor 2 to rapidly charge via the third resistor 10, the diode 102 and the first resistor 4, which in turn rapidly increases the inverted input voltage of the operational amplifier 6 once the second capacitor 14 has charged (see B in FIG. 2(3)). Further, the second capacitor 14 is charged to obtain the reference voltage $V_{REF}$, leading the noninverted input voltage of the operational amplifier 6 to the ($V_{REF}$-$V_F$) level. This causes the diode 102 to open. As a result, the first capacitor 2 is charged by the output of the operational amplifier 6 via the second resistor 8 and the first resistor 4, so that the inverted input voltage of the operational amplifier 6 equals the reference voltage $V_{REF}$ (see y in FIG. 2(3)). As a result, the time required for amplifying signals based on the reference voltage can be somewhat shortened by connecting the diode 102.

The conventional amplifier described above does have disadvantages. First, a long time elapses before the second capacitor 14 charges the reference voltage, because it is performed via the third resistor 10. Second, the first capacitor 2 is shut off before it obtains the reference voltage $V_{REF}$ due to the forward voltage $V_F$ of the diode 102. As a result, there is a considerable time lag before the noninverted input voltage of the operational amplifier 6 equals reference voltage $V_{REF}$ after second capacitor 14 fully charges. Consequently, a long time is required before signals are amplified.

The ways to shorten the time required for amplifying signals are as follows. The first way is to lower the second resistor 8 to smaller level. The second way is to lower the third resistor 10 and the fourth resistor 12 to smaller level. The third way is to downgrade the capacity of the second capacitor 14.

Unfortunately, the first way reduces the amplification factor A. The second way increases power consumption in the third resistor 10 and the fourth resistor 12. The third way makes the reference voltage $V_{REF}$ less stable. For these reasons, it is impossible to take these steps.

OBJECTS AND SUMMARY OF THE INVENTION

An object of the present invention is to overcome the aforementioned problems and provide an amplifier which can amplify signals more rapidly by a specific amplification factor without inhibiting electrical characteristics.

According to a feature of the invention, there is provided an amplifier with a short timelag comprising:
  an operational amplifier receives a signal at a first input via a first capacitor and a first resistor, and which is provided a divided supply voltage obtained using a third resistor and a fourth resistor at a second input;
  a second capacitor which is connected in parallel with the fourth resistor;
  a first switching means which is connected in parallel with the third resistor;
  a second switching means which is connected to the operational amplifier between the first input and the second input; and
  a switch controlling means which allows the first switching means and the second switching means to conduct when power is initially received, and which allows the first switching means and the second switching means to open when the second capacitor fully charges.

According to another feature of the invention, there is provided an amplifier comprising:

a first capacitor terminal for connecting a first capacitor;

an operational amplifier which is given a signal at a first input via the first capacitor connected to the first capacitor connected to the first capacitor terminal and a first resistor, and which is provided a divided supply voltage obtained using a third resistor and a fourth resistor to a second input;

a second capacitor which is connected in parallel with the fourth resistor;

a second capacitor terminal for connecting the second capacitor in parallel with the fourth resistor;

a first switching means which is connected in parallel with the third resistor;

a second switching means which is connected to the operational amplifier between the first input and the second input; and a switch controlling means which allows the first switching means and the second switching means to conduct when power is initially received, and which allows the first switching means and the second switching means to open when the second capacitor is fully charged.

While the novel features of the invention are set forth in a general fashion, the invention, both as to organization and content, will be better understood and appreciated, along with other objects and features thereof, from the following detailed description taken in conjunction with the drawings.

BRIEF DESCRIPTION OF THE DRAWINGS

FIG. 2(1), 2(2) and 2(3) are a series of waveform diagrams showing actuation of the circuit of FIG. 1.

FIGS. 4(1), 4(2) and 4(3) are a series of waveform diagrams showing actuation of the circuit of FIG. 3.

DESCRIPTION OF THE PREFERRED EMBODIMENT

Figure 1:
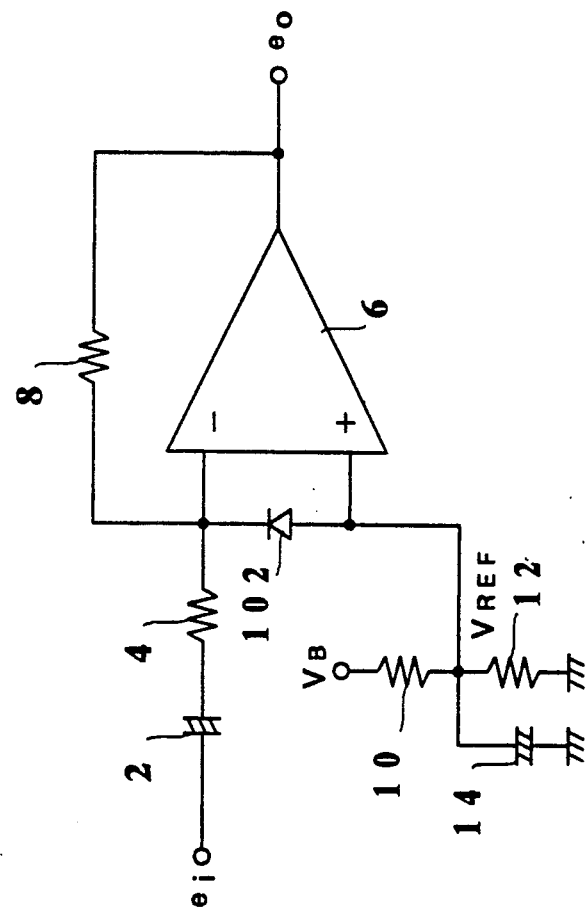
FIG. 1 is a circuit diagram of a conventional amplifier.
Figure 3:
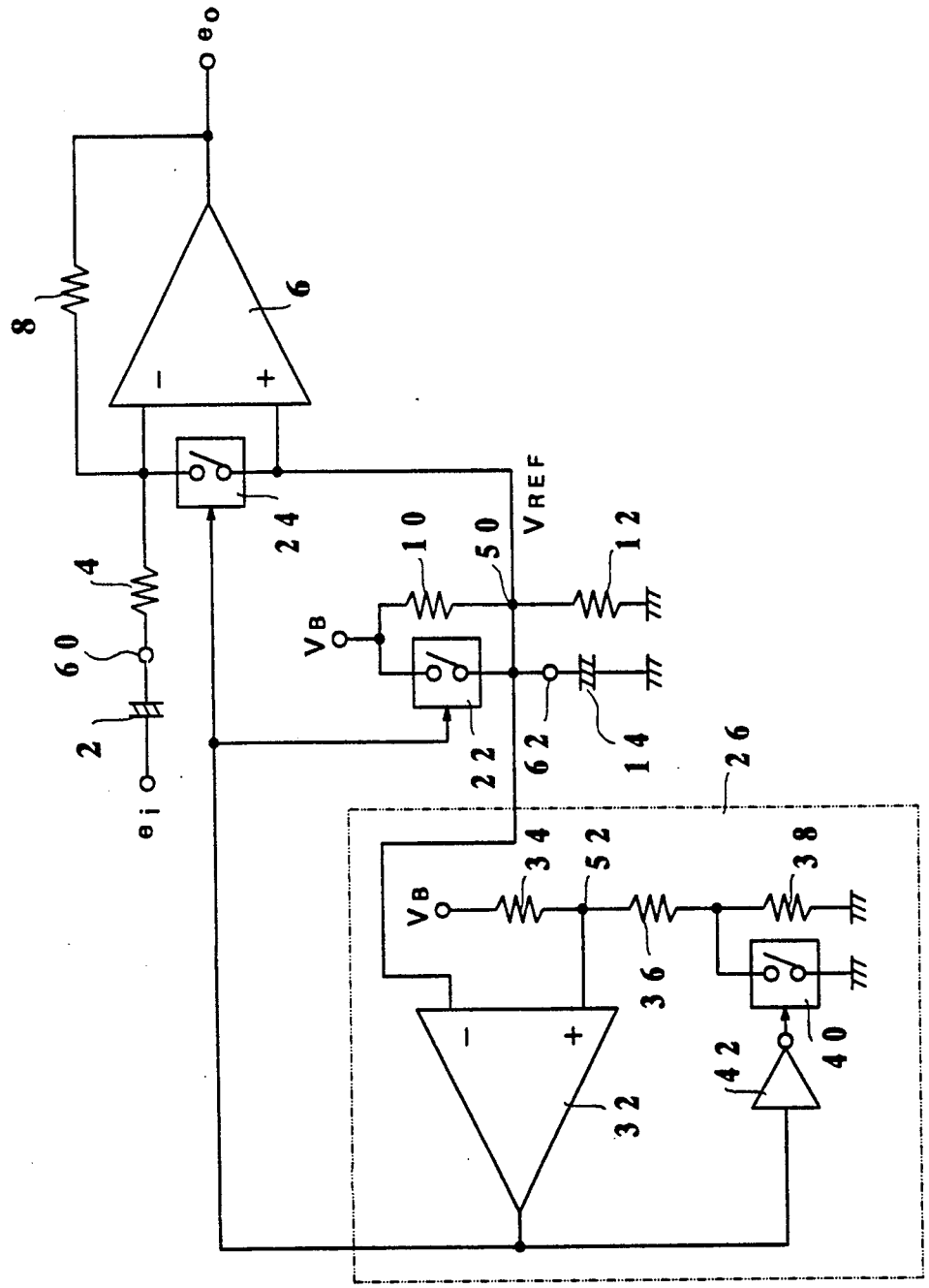
FIG. 3 is a circuit diagram of an amplifier according to an embodiment of the present invention.

A circuit diagram of an integrated circuit including an amplifier according to an embodiment of the present invention is shown in FIG. 3, in which the same reference numerals designate the corresponding elements of the conventional amplifier shown in FIG. 1. In FIG. 3, a first capacitor 2 and a second capacitor 14 are external capacitors connected to the integrated circuit using a first capacitor terminal 60 and a second capacitor terminal 62, respectively.

A signal $e_i$ to be amplified passes to an inverted input, which is a first input of an operational amplifier 6, via the first capacitor 2 and a first resistor 4. An output signal derived from the operational amplifier 6 is fed back to the inverted input via a second resistor 8. Here, the amplification factor A of the operational amplifier 6 is given by:

$$A = R_2/R_1$$

wherein $R_1$ and $R_2$ are the resistor values of the first resistor 4 and that of the second resistor 8, respectively.

A supply of DC voltage $V_B$, which is supplied by a power source, is divided by a voltage divider containing a third resistor 10 and a fourth resistor 12. The voltage thus divided is passed to a noninverted input which is a second input acting as a noninverted input voltage of the operational amplifier 6. The divided voltage is given by:

$$\{R_4/(R_3+R_4)\} \cdot V_B$$

wherein $R_3$ and $R_4$ are the resistance values of the third resistor 10 and that of the fourth resistor 12, respectively. Although the divided voltage is constant under a fixed supply voltage $V_B$, the supply voltage $V_B$, may change due to noise contamination thereby varying the divided voltage. In order to overcome the above drawback, the second capacitor 14 is connected in parallel with the fourth resistor 12. Once charged, the second capacitor 14 allows a reference voltage $V_{REF}$ ($V_{REF}=\{R_4/(R_3+R_4)\} \cdot V_B$) to remain almost constant regardless of variation in the supply voltage $V_B$. In the present invention, an output $e_o$ from the operational amplifier 6 is given by ($V_{REF}+A \cdot e_i$), provided that the second capacitor 14 is charged to obtain the reference voltage $V_{REF}$ and that the inverted input voltage of the operational amplifier 6 is equal to the reference voltage $V_{REF}$.

In this invention, a first switch 22, acting as a first switching means, is connected in parallel with the third resistor 10. In addition, a second switch 24, acting as a second switching means, is incorporated into the operational amplifier 6 between the inverted input and the noninverted input. The first switch 22 and the second switch 24 comprise electronic switches such as analog switches or the like, and the switching function is controlled by a switch controlling means 26. A high level signal outputted from the switch controlling means 26 causes the first switch 22 and the second switch 24 to conduct, whereas a low level signal therefrom allows switches 22 and 24 to open. With the exception of first capacitor 2 and second capacitor 14, the entire amplifier can be constructed on, for example, a piece of C-MOSIC microchip, this realizing low power consumption.

In the switch controlling means 26, an inverted input of the operational amplifier 32 is connected to a junction point 50, to which the third resistor 10 and the fourth resistor 12 are also connected. The supply voltage $V_B$ provided by a power source is divided by resistors 34, 36 and 38. A non inverted input of the operational amplifier 32 is connected to a junction point 52, to which the resistor 34 and the resistor 36 are also connected. A switch 40 is connected in parallel with the resistor 38. Output signals from the operational amplifier 32 are sent to the first switch 22, the second switch 24, and switch 40 via an inverted circuit 42. The switch 40 comprises, for example, electronic switches such as analog switches or the like in the same manner as the first switch 22 and the second switch 24. A high level signal causes the switch 40 to conduct, whereas a low level signal causes switch 40 to open. Here, the following is given:

$$R_3 = R_5, R_4 = R_6 + R_7$$

wherein $R_5$, $R_6$ and $R_7$ are the resistor values of the resistor 34, that of the resistor 36 and that of the resistor 38, respectively.

When power is initially received from a power supply, the inverted input voltage of the operational amplifier 32 is nearly zero, because the second capacitor 14 has not yet charged. On the other hand, the noninverted input voltage of the operational amplifier 32 is given by:

$$\{(R_6+R_7)/(R_5+R_6+R_7)\} \cdot V_B = \{R_4/(R_3+R_4)\} \cdot V_B$$

This means that the inversion input voltage is higher than the inverted input voltage, and so a high level signal is output from the operational amplifier 32 (see FIG. 4(1)).

Responding to the high level signal outputted from the operational amplifier 32 of the switch controlling means 26, the first switch 22 and the second switch 24 conduct electricity. As a result, the second capacitor 14 is rapidly charged by supply voltage $V_B$ via the first switch 22 (see a in FIG. 4(2)). In addition, the first capacitor 2 is rapidly charged by the supply voltage $V_B$ via the first switch 22, the second switch 24 and the first resistor 4, such that the inverted input voltage of the operational amplifier 6 equals the voltage of the second capacitor 14 (see a in FIG. 4(3)). Incidentally, while high level signals are outputted from the operational amplifier 32, the inverted circuit 42 outputs a low level signal, which opens the switch 40. Consequently, the noninverted input voltage of operational amplifier 32 maintains the level of $\{R_4/(R_3+R_4)\} \cdot V_B$.

When the second capacitor 14 charges to reference voltage $V_{REF}$ due to a rapid rise in a charged voltage, the inverted input voltage and the noninverted input voltage of the operational amplifier 32 are equalized. This causes the operational amplifier 32 to output a low level signal (see FIG. 4(1)). Responding to the low level signal outputted from the operational amplifier 32 of the switch controlling means 26, the first switch 22 and the second switch 24 break. This causes the second capacitor 14 to cease charging and maintain the reference voltage $V_{REF}$ (see B in FIG. 4(2)). Further, the inverted input voltage of the operational amplifier 6 becomes equal to the reference voltage $V_{REF}$ (see B in FIG. 4(3)). Incidentally, while low level signals are outputted from the operational amplifier 32, the inverted circuit 42 outputs a high level signal, with the result that the switch 40 conducts. As a result, the inverted input voltage of the operational amplifier 32 decreases down to the level of $\{R_6/(R_5+R_6)\} \cdot V_B$. Due to this, the noninverted input voltage does not exceed the reference voltage $V_{REF}$, regardless of a little variation in the supply voltage $V_B$. Subsequently, the first switch 22 and the second switch 24 remain open.

As described above, by using this amplifier, the second capacitor 14 can be rapidly charged to obtain the reference voltage $V_{REF}$, whereby the inverted input voltage of the operational amplifier 6 becomes equal to the reference voltage $V_{REF}$. For these reasons, a signal $e_i$ can be amplified on the basis of the reference voltage $V_{REF}$ by the amplification factor A in a short period of time. In addition, there is no need to lower the resistor value of the second resistor 8, the third resistor 10 and the fourth resistor 12, or to decrease the capacity of the second capacitor 14. As a result, this amplifier does not inhibit electrical characteristics.

In an embodiment described above, the switching system for charging inputs to an amplifier is constructed from C-MOSIC microchip but it can be made of discrete parts.

Further, the first switch 22, the second switch 24 and the switch 40 comprise electronic switches. These switches may, however, comprise mechanical switches such as relay switches.

Moreover, although the switch controlling means 26 includes the operational amplifier 32 or the like, it may utilize a microprocessor or the like.

As mentioned above, the present invention includes the first switch 22 connected in parallel with the third resistor 10, the second switch 24 incorporated into the operational amplifier between the inverted input and the noninverted input, and the switch controlling means 26. The switch controlling means 26 regulates the first switch 22 and the second switch 24 so as to conduct electricity at the moment initial power is received from a power supply, whereas it regulates them so as to stop conducting electricity after the second capacitor 14 is charged to obtain the reference voltage.

Therefore, by using this amplifier, the second capacitor 14 can be rapidly charged to obtain the reference voltage $V_{REF}$, and the inverted input voltage of the operational amplifier becomes equal to the reference voltage $V_{REF}$. For these reasons, in a short time, a signal $e_i$ can be amplified on the basis of the reference voltage $V_{REF}$ by the amplification factor A. In addition, there is no need to lower the resistance value of the second resistor 8, the third resistor 10 and the fourth resistor 12, or to decrease the capacity of the second capacitor. As a result, this amplifier does no inhibit electrical characteristics.

Although the invention has been described in its preferred form with a certain degree of particularity, it is understood that the present disclosure of the preferred form can be changed in the details of its construction, and any combination or arrangement of parts may be resorted to without departing from either the spirit or the scope of the invention as hereinafter claimed.

What is claimed is:

1. An amplifier comprising:
   an operational amplifier which is given a signal to be amplified at a first input via a first capacitor and a first resistor, and receiving a divided supply voltage obtained using a third resistor and a fourth resistor at a second input;
   a second capacitor in parallel with the fourth resistor:
   a first switching means in parallel with the third resistor;
   a second switching means connected to the operational amplifier between the first input and the second input; and
   a switch controlling means which allows the first switching means and the second switching means to conduct at the moment initial power is received, and which allows the first switching means and the second switching means to break when the second capacitor is completely charged.

2. An amplifier as claimed in claim 1, wherein said switch controlling means compares a charged voltage of the second capacitor and a reference voltage, so that the switch controlling means allows the first switching means and the second switching means to conduct when the charged voltage of the second capacitor is smaller than the reference voltage, and to break when the charged voltage of the second capacitor is larger than the reference voltage.

3. An amplifier as claimed in claim 2, wherein said switch controlling means allows the reference voltage to be downgraded when the charged voltage of the second capacitor exceeds the reference voltage after initial power is received.

4. An amplifier comprising:

a first capacitor terminal for connecting a first capacitor;
an operational amplifier which receives a signal to be amplified at a first input via the first capacitor connected to the first capacitor terminal and a first resistor, and which receives a divided supply voltage obtained using a third resistor and a fourth resistor at a second input;
a second capacitor in parallel with the fourth resistor;
a second capacitor terminal connecting the second capacitor in parallel with the fourth resistor;
a first switching means in parallel with the third resistor;
a second switching means connected to the operational amplifier between the first input and the second input; and
a switch controlling means which allows the first switching means and the second switching means to conduct at a moment initial power is received, and which allows the first switching means and the second switching means to break when the second capacitor is charged.

5. An amplifier as claimed in claim 4, wherein said switch controlling means compares a charged voltage of the second capacitor and a reference voltage, such that the switch controlling means allows the first switching means and the second switching means to conduct when the charged voltage of the second capacitor is smaller than the reference voltage, and to break when the charged voltage of the second capacitor is larger than the reference voltage.

6. An amplifier as claimed in claim 5, wherein said switch controlling means allows the reference voltage to be downgraded when the charged voltage of the second capacitor exceeds the reference voltage after initial power is received.

* * * * *